(12) United States Patent
Iinuma

(10) Patent No.: US 7,825,433 B2
(45) Date of Patent: Nov. 2, 2010

(54) MIS-TYPE SEMICONDUCTOR DEVICE

(75) Inventor: Toshihiko Iinuma, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 442 days.

(21) Appl. No.: 11/898,602

(22) Filed: Sep. 13, 2007

(65) Prior Publication Data
US 2008/0128748 A1 Jun. 5, 2008

(30) Foreign Application Priority Data
Sep. 13, 2006 (JP) ............................. 2006-248376

(51) Int. Cl.
*H01L 27/088* (2006.01)
(52) U.S. Cl. .................. 257/192; 257/190; 257/196; 257/E29.025
(58) Field of Classification Search .................. 257/190, 257/192, 196, E29.025, E29.082
See application file for complete search history.

(56) References Cited
U.S. PATENT DOCUMENTS

| | | | |
|---|---|---|---|
| 3,566,215 A * | 2/1971 | Heywang ........................ 257/6 |
| 6,621,131 B2 * | 9/2003 | Murthy et al. .............. 257/408 |
| 6,770,942 B2 | 8/2004 | Iinuma | |
| 2001/0003364 A1 * | 6/2001 | Sugawara et al. ........... 257/192 |
| 2004/0113209 A1 | 6/2004 | Izuha et al. | |
| 2006/0186436 A1 * | 8/2006 | Tamura et al. ............... 257/192 |

* cited by examiner

*Primary Examiner*—Lex Malsawma
*Assistant Examiner*—Robert Huber
(74) *Attorney, Agent, or Firm*—Finnegan, Henderson, Farabow, Garrett & Dunner, L.L.P.

(57) ABSTRACT

A semiconductor device having a silicide film above source-drain regions comprises an element isolation insulating film which is provided so as to enclose an element forming region of a semiconductor substrate whose main component is silicon and contains silicon oxide as a main component, a gate electrode which is formed above the element forming region via a gate insulating film, diffused layers which are formed in the semiconductor substrate so as to sandwich a channel region below the gate electrode, semiconductor regions which are formed so as to sandwich the channel region and diffused regions and are composed of semiconductor material whose lattice constant differs from that of silicon, a silicon nitride film which is formed between the semiconductor regions and the element isolation insulating film and above the lowest part of the semiconductor regions, and a conducting film which is formed at the surface of the semiconductor regions.

9 Claims, 5 Drawing Sheets

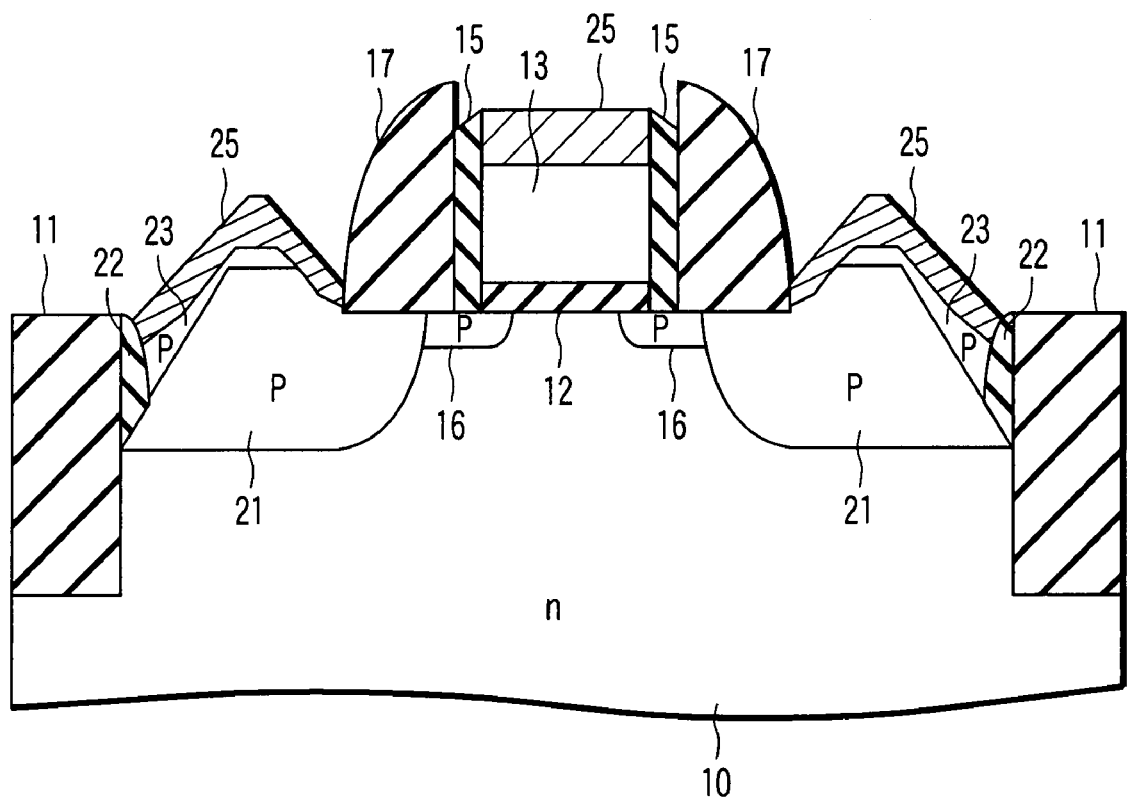
F I G. 1

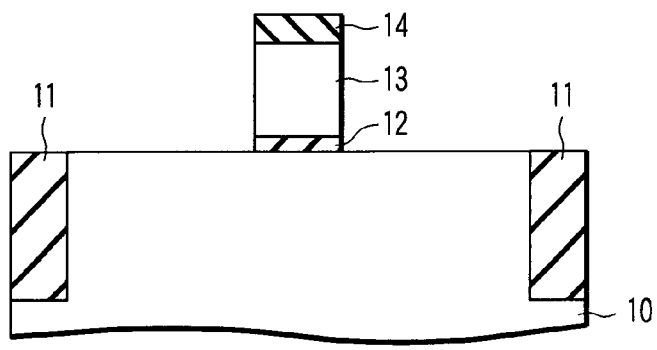
F I G. 2A
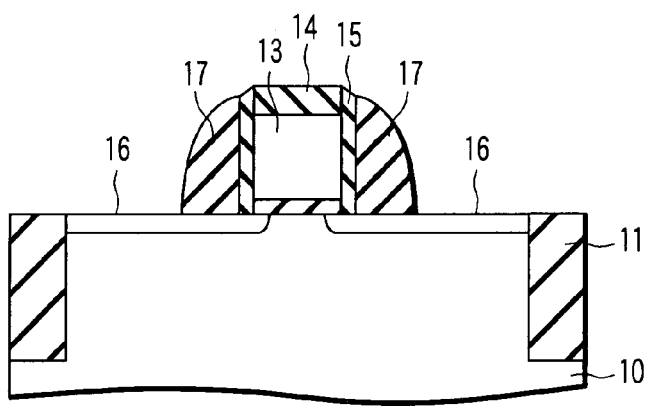
F I G. 2B
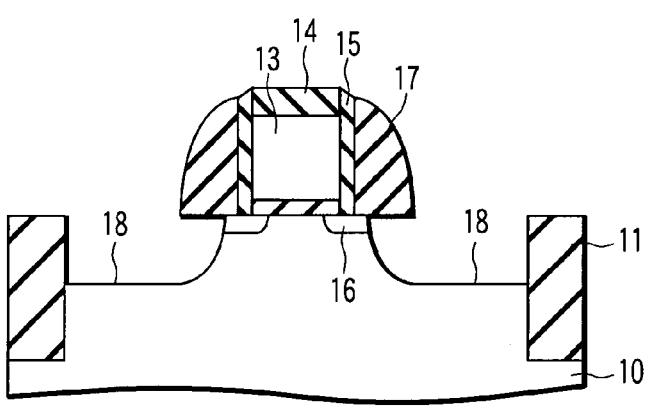
F I G. 2C
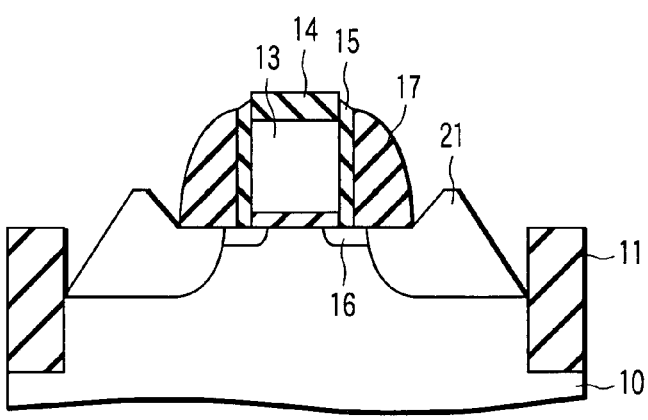
F I G. 2D

MIS-TYPE SEMICONDUCTOR DEVICE

CROSS-REFERENCE TO RELATED APPLICATIONS

This application is based upon and claims the benefit of priority from prior Japanese Patent Application No. 2006-248376, filed Sep. 13, 2006, the entire contents of which are incorporated herein by reference.

BACKGROUND OF THE INVENTION

1. Field of the Invention

This invention relates to a Metal-Insulator-Semiconductor-type (MIS-type) semiconductor device, and more particularly to a semiconductor device having a silicide film above the source-drain diffused layer regions and a method of manufacturing the semiconductor device.

2. Description of the Related Art

In recent years, MIS-type Field-Effect Transistors (FETs) have been required to provide improved element characteristics, particularly higher operating speed and lower power consumption. To speed up FETs, it is necessary to improve the current driving power of the component elements.

In conventional FETs, a reduction in the gate length has improved the current driving power. With the recent progress in miniaturization, however, only the reduction of the gate length has no longer assured a sufficient improvement in the current driving power. For this reason, the current driving power is requested to be improved by another method. As an example, a method of improving the mobility of carriers by applying a stress to the channel region of an FET has been used.

A configuration to apply a stress to the channel region is a structure that sandwiches a channel region with semiconductor materials whose lattice constant differs from that of the channel region. Specifically, silicon-germanium (SiGe) whose lattice constant is slightly larger than that of silicon (Si) is embedded in the source-drain (diffused layer) region of a p-channel MOSFET. Then, the stress produced by the difference in lattice constant between Si and SiGe is used. The substrate used to form elements is n-type Si. On the source-drain diffused layer region, an NiSi film is formed to decrease resistance.

In this type of semiconductor device, the following phenomenon occurs: the NiSi film formed on the source-drain diffused layer region projects into the Si substrate. When the NiSi film has projected into the substrate, the NiSi film comes into contact with not only the p-type SiGe region but also the n-type Si substrate. In this case, when a voltage is applied to the source-drain diffused layer region, a problem occurs: current flows from the NiSi film to the n-type Si substrate.

BRIEF SUMMARY OF THE INVENTION

According to an aspect of the invention, there is provided a semiconductor device comprising: an element isolation insulating film which is provided so as to enclose an element forming region of a semiconductor substrate whose main component is silicon and is composed of an insulating material whose main component is silicon oxide; a gate electrode which is formed above the element forming region via a gate insulating film; diffused layers which are formed in the semiconductor substrate so as to sandwich a channel region below the gate electrode; semiconductor regions which are formed so as to sandwich the channel region and diffused regions and are composed of semiconductor material whose lattice constant differs from that of silicon and which have the same conductivity type as that of the diffused layers; a silicon nitride film which is formed between the semiconductor regions and the element isolation insulating film and above the lowest part of the semiconductor regions; and a conducting film which is formed at the surface of the semiconductor regions.

According to another aspect of the invention, there is provided a semiconductor device comprising: an element isolation insulating film which is provided so as to enclose an element forming region of a n-type silicon substrate and is made of a silicon oxide; a gate electrode which is formed above the element forming region via a gate insulating film; p-type diffused layers which are formed in the silicon substrate so as to sandwich a channel region below the gate electrode; p-type semiconductor regions which are formed so as to sandwich the channel region and diffused layers and are composed of a mixture of germanium and silicon; a silicon nitride film which is formed between the semiconductor regions and the element isolation insulating film and above the lowest part of the semiconductor regions; and a conducting film which is formed at the surface of the semiconductor regions and is composed of a compound of the semiconductor of the semiconductor region and metal.

According to still another aspect of the invention, there is provided a method of manufacturing a semiconductor device comprising: forming an element isolation insulating film whose main component is silicon oxide so as to enclose an element forming region of a semiconductor substrate whose main component is silicon; forming a gate electrode via a gate insulating film above the element forming region enclosed by the element isolation insulating film; forming diffused layers in the semiconductor substrate so as to sandwich a channel region below the gate electrode; selectively etching a part of the semiconductor substrate in a region where the channel region and diffused regions are sandwiched; epitaxially growing in the etched part of the substrate a first semiconductor region composed of a semiconductor material whose lattice constant differs from that of silicon; forming a silicon nitride film between the first semiconductor region and the element isolation insulating film by sidewall leaving techniques; epitaxially growing a second semiconductor region composed of the same material as that of the first semiconductor region above the first semiconductor region and silicon nitride film; and a conducting film which is formed at the surface of the second semiconductor region.

According to still another aspect of the invention, there is provided a method of manufacturing a semiconductor device comprising: forming an element isolation insulating film made of silicon oxide so as to enclose an element forming region of a n-type silicon substrate; forming a gate electrode via a gate insulating film above the element forming region enclosed by the element isolation insulating film; forming p-type diffused layers in the silicon substrate so as to sandwich a channel region below the gate electrode; selectively etching a part of the silicon substrate in a region where the channel region and p-type diffused layers are sandwiched; forming a first p-type semiconductor region composed of a mixture of germanium and silicon in the etched part of the silicon substrate; forming a silicon nitride film between the first p-type semiconductor region and the element isolation insulating film by sidewall leaving techniques; forming a second p-type semiconductor region composed of the same material as that of the first semiconductor region on the first p-type semiconductor region and silicon nitride film; and forming at the surface of the second p-type semiconductor region a conducting film composed a compound of the semiconductor of the semiconductor region and metal.

BRIEF DESCRIPTION OF THE SEVERAL VIEWS OF THE DRAWING

FIG. 1 is a sectional view schematically showing the configuration of a MOS semiconductor device according to a first embodiment of the invention;

FIGS. 2A to 2G are sectional views showing the manufacturing processes of the MOS semiconductor device of the first embodiment;

DETAILED DESCRIPTION OF THE INVENTION (Basic Principle)

Before the explanation of an embodiment of the invention, the basic principle of the invention will be explained.

Figure 3:
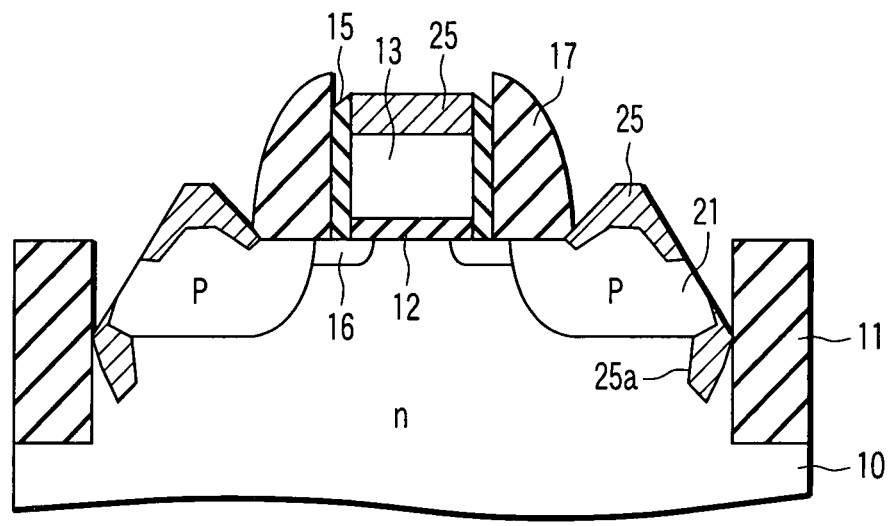
FIG. 3 is a sectional view to help explain the principle of the invention, showing an example of applying a compressive stress to the channel region by embedding SiGe in the source-drain region of the MOS semiconductor device.

FIG. 3 is a sectional view schematically showing the configuration of a p-channel MOSFET whose element driving power has been improved. In the p-channel MOSFET, a compressive stress is applied to the channel region by embedding SiGe in the source-drain diffused layer region. In FIG. 3, numeral 10 indicates an n-type Si substrate, 11 an element isolation insulating film, 12 a gate insulating film, 13 a gate electrode, 15 a sidewall insulating film, 16 a p-type source-drain extension layer, 17 a sidewall insulating film, 21 an epitaxial SiGe layer serving as a p-type source-drain region, and 25a silicide film, such as NiSi.

However, in the MOSFET formed by the above techniques, the following phenomenon may take place: the silicide film 25a projects into the Si substrate in the vicinity of the interface between the SiGe layer 21 and the element isolation insulating film 11.

Figure 4A:
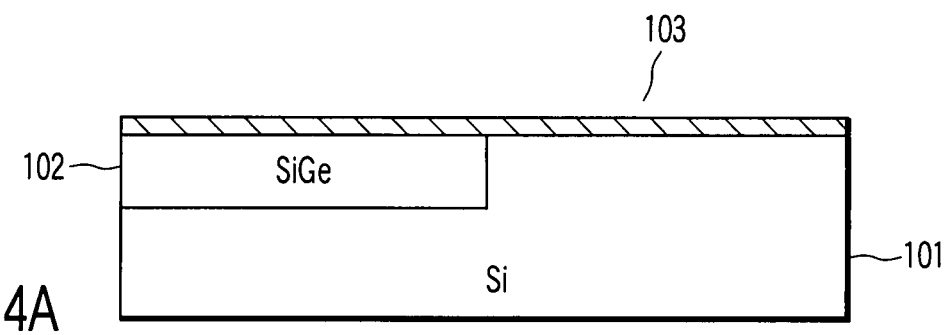
FIGS. 4A and 4B are pattern diagrams to help explain problems occurred in the MOS semiconductor device of FIG. 3.
Figure 4B:
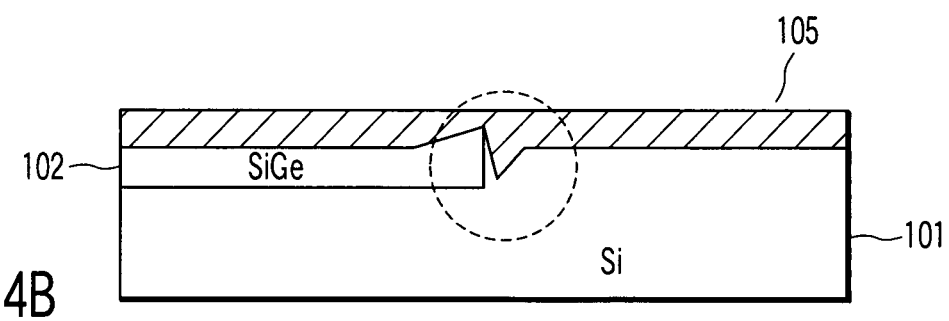

FIGS. 4A and 4B are pattern diagrams to help explain why the phenomenon occurs. As shown in FIG. 4A, there is prepared a structure where a silicon-germanium (SiGe) region 102 is embedded in a part of the Si substrate 101. Then, after a nickel (Ni) film 103 is deposited on the structure, heat treating is done, thereby causing the Ni film 103 to react with the Si substrate 101 and SiGe region 102. In this case, as seen from the part enclosed by a broken line in FIG. 4B, the following phenomenon occurs: Ni flows into the Si substrate 101 in the vicinity of the interface between the region where the Si substrate is exposed at the surface and the SiGe region 102.

Such a phenomenon occurs since the exposed region of the Si substrate 101 reacts faster with the Ni film than the SiGe region 102. This is because the comparison of binding energy between the bond of an Ni atom and an Si atom and the bond of an Ni atom and a Ge atom has shown that the Ni—Si bond is stronger and more stable than the Ni—Ge bond.

For the above reason, in the region where the SiGe region and the Si region are close to each other, the phenomenon of the NiSi film getting thicker locally takes place. Therefore, like the vicinity of the interface between the SiGe layer 21 and the element isolation insulating film 11 in FIG. 3, Ni flows into the region where the SiGe layer 21 gets extremely thin at the time of heat treatment, with the result that NiSi projects into the Si substrate. In this case, when a voltage is applied to the source-drain region, current flows from the NiSi film to the n-type Si substrate.

To avoid this, thickening the film thickness of the SiGe layer 21 in the vicinity of the element isolation insulating film 11 is effective. However, when an attempt is made to form an SiGe region on a (100) substrate by selective epitaxial growth using CVED techniques, it is difficult to suppress the generation of a facet in the region where the SiGe region makes contact with the silicon oxide film (element isolation insulating film 11).

Taking such conditions into account, the inventors have considered a structure which can prevent the phenomenon of the metal silicide from projecting into the Si substrate without thickening the SiGe layer and make an improvement in the driving power of the MOSFET and a decrease in the parasitic resistance compatible with the suppression of the occurrence of a junction leak.

Embodiment

Hereinafter, the details of the invention will be explained using an embodiment shown in the figures.

FIG. 1 is a sectional view schematically showing the configuration of a MOS semiconductor device according to an embodiment of the invention. In the semiconductor device, a compressive stress is applied by embedding SiGe in the source-drain region of a p-channel MOSFET, thereby improving the driving power of the element.

In FIG. 1, numeral 10 indicates an n-conductivity-type Si substrate (semiconductor substrate) having (100) surface direction. At the surface of the Si substrate 10, an element isolation insulating film 11 composed of a silicon oxide film is formed so as to enclose an element forming region. On the element forming reason of the Si substrate, a gate electrode 13 composed of polysilicon is formed via a gate insulating film 12 composed of a silicon oxide film. On the sidewall of the gate electrode 13, a first sidewall insulating film (offset spacer) 15 composed of a silicon nitride film is formed. Further on the outside of the first sidewall insulating film, a second sidewall insulating film 17 composed of a silicon oxide film is formed.

At the surface of the substrate 10, p-type diffused layers (or source-drain extension regions) 16 are formed so as to sandwich a channel region below the gate electrode between them. Further at the surface of the substrate 10, p-type semiconductor regions 21 are formed so as to sandwich the channel region and p-type diffuse layers 16 between them in the channel length direction. On the semiconductor regions 21, second semiconductor regions 23 are formed. Then, between the semiconductor regions 21, 23 and the element isolation insulating film 11, a silicon nitride film 22 is formed. Moreover, on the surface of the second semiconductor region 23 and gate electrode 13, a silicide film 25, such as NiSi, is formed.

Next, the processes of manufacturing the semiconductor device of the embodiment will be explained using FIGS. 2A to 2G.

First, as shown in FIG. 2A, an element isolation insulating film (STI) 11 composed of a silicon oxide film is formed at the surface of the n-conductivity-type Si substrate 10 having (100) surface direction so as to enclose an element forming region. Then, on the element forming region, a gate insulating film 12, a polysilicon film (gate electrode) 13, and a silicon nitride film 14 are formed in that order, thereby forming a stacked structure film. Thereafter, the stacked structure film is patterned, thereby forming a gate electrode structure.

Next, as shown in FIG. 2B, after a thin silicon nitride film (of about 2 to 10 nm in thickness) is deposited on the entire surface of the substrate, silicon nitride film is subjected to anisotropic etching, such as RIE, thereby forming an offset spacer as a first sidewall insulating film 15 on the side of the gate electrode structure. Then, using the gate electrode structure and sidewall insulating film 15 as a mask, impurities, such as boron, are implanted by ion implantation techniques, thereby forming a p-type diffused layer (or source-drain extension region) 16 at the surface of the exposed n-type Si substrate. Then, after a silicon oxide film is deposited on the entire surface, the silicon oxide film is subjected to anisotropic etching, such as RIE, thereby forming a second sidewall insulating film 17.

Next, as shown in FIG. 2C, the exposed region of the Si substrate 10 is etched using anisotropic etching, such as RIE, isotropic etching, such as CDE, or both of these techniques. With the etching, grooves 18 are made in the source-drain contact forming region of the transistor. That is, the grooves 18 that sandwich the channel region and diffused layers 16 between them in the channel length direction.

Then, as shown in FIG. 2D, a boron-added SiGe layer (with a Ge concentration: about 10 to 30 atm %) is selectively grown epitaxially by CVD techniques, thereby forming a first SiGe region (or a first semiconductor region) 21 of the p+ conductivity type. At this time, in the SiGe region 21 formed using selective epitaxial growth techniques in the CVD method, a facet develops in the region where the SiGe region is in contact with the element isolation insulating film 11 as in FIG. 3, with the result that the region becomes extremely thin.

In the prior art, after the state, the silicon nitride film 14 is removed by, for example, an etching process using thermal phosphoric acid and, for example, a nickel (Ni) film is deposited as silicide forming metal to a thickness of about 10 nm on the entire surface. Then, a heat treatment is performed at about 300 to 450° C., causing Si or SiGe at the surface of the gate electrode 31 and SiGe region 21 to react with the Ni film, which forms a nickel silicide film. Then, after the unreacted Ni film is removed by such a chemical as sulfuric acid hydrogen peroxide mixture (SPM) or ammonia hydrogen peroxide mixture (APM), the resulting film is heat-treated at 400° C. to 500° C., thereby turning the nickel silicide film completely into a low-resistance nickel monosilicide (NiSi) film.

In the transistor formed by such conventional techniques, the following phenomenon occurs: the NiSi film projects into the Si substrate in the vicinity of the interface between the source-drain-contact region of the transistor and the element isolation insulating film as shown in FIG. 4.

Figure 5:
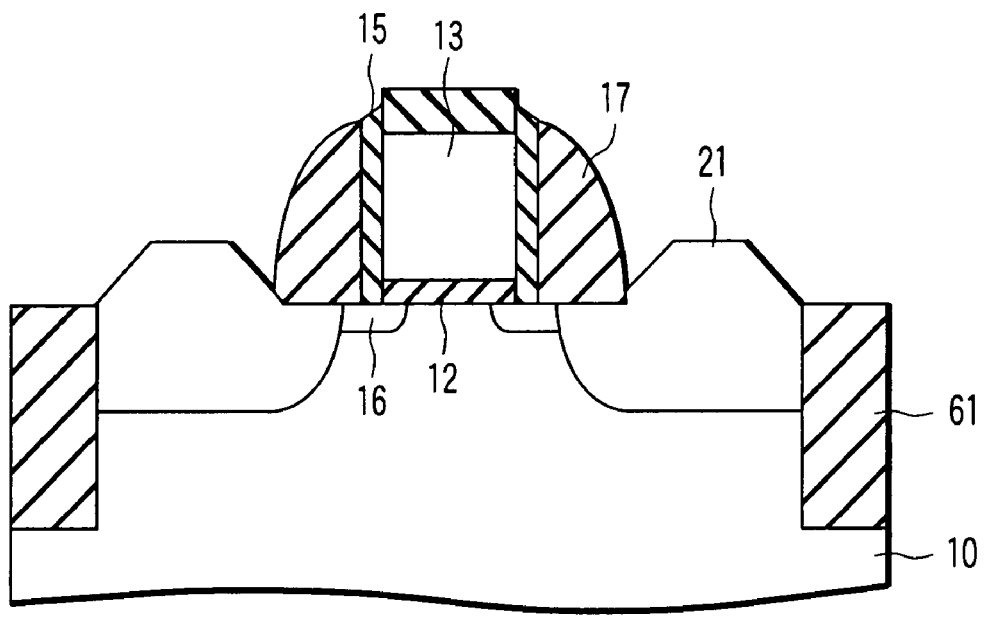
FIG. 5 is a sectional diagram showing a structure the inventors have proposed to solve the problems encountered in the device of FIG. 3.
Figure 6:
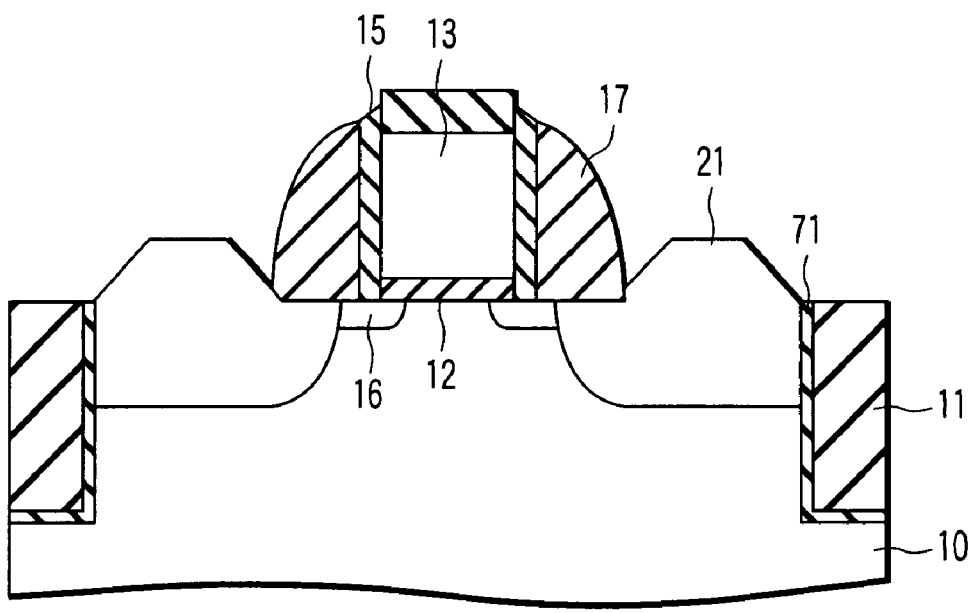
FIG. 6 is a sectional diagram showing a structure the inventors have proposed to solve the problems encountered in the device of FIG. 3.

To avoid the above problem, the inventors have devised a configuration where a silicon nitride film 61 is embedded in the element isolating region in place of the silicon oxide film 11, as shown in FIG. 5. Moreover, as shown in FIG. 6, the inventors have devised a configuration where the element isolating region is composed of two layers: a silicon nitride film 71 serving as a liner and a silicon oxide film 11 serving as embedded material. With these configurations, the SiGe region 21 can be prevented from getting thinner because of the formation of a facet in the vicinity of the region of the element isolation insulating film.

However, since the configurations cause a new problem of having an adverse effect on various element characteristics, it is difficult to use element isolation insulating films having the configurations. That is, in the case of the configuration of FIG. 5, a stress on the element isolation insulating film region becomes very large, having an adverse effect on the element characteristics. In the case of the configuration of FIG. 6, the silicon nitride film liner might project like a horn and break, contributing to the generation of particles.

In the embodiment, to avoid this, after an SiGe layer having a facet at the STI end is formed, the sidewall of SiN is formed at the STI end and an SiGe layer is formed again, thereby preventing the SiGe layer from getting thinner at the STI end.

Figure 2E:
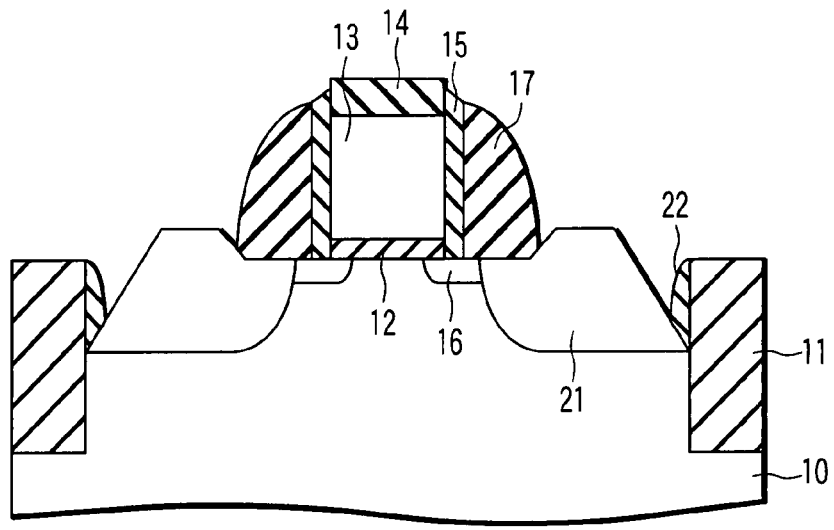

Specifically, after the growth of the first SiGe region 21 shown in FIG. 2D, a silicon nitride film is deposited on the entire surface as shown in FIG. 2E. Then, by anisotropic etching, such as RIE, a sidewall of a silicon nitride film 22 is formed on the sidewall of the element isolation insulating film 11 on the element forming region side.

Here, by forming the sidewall of the silicon nitride film 22 using sidewall leaving techniques as in the embodiment, the silicon does not adversely affect the element characteristics unlike the structure of FIG. 5 where the whole of the element isolation insulating film 11 is made of a silicon nitride film. Moreover, unlike the structure of FIG. 6, the silicon nitride film liner has no disadvantage of contributing to the occurrence of particles. This is because, in contrast with the example of FIG. 6, the silicon nitride film 22 constituting the sidewall is formed later than the silicon oxide film constituting the element isolation insulating film 11.

Figure 2F:
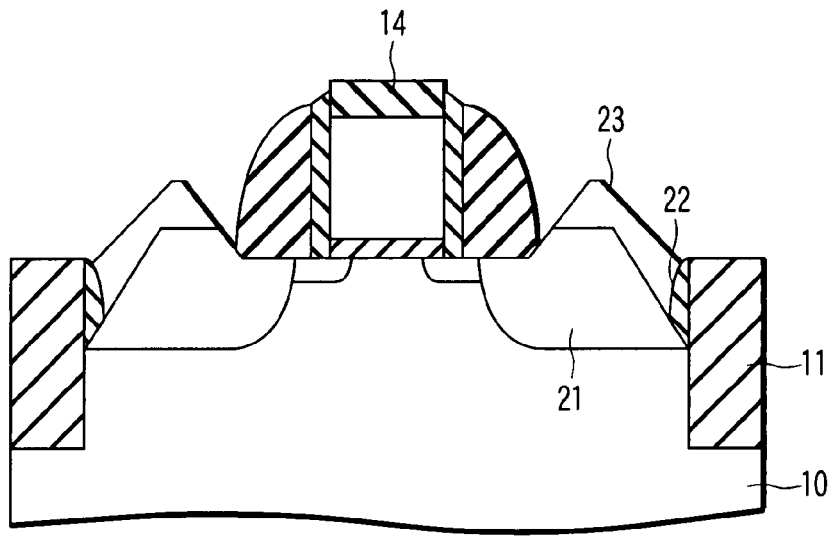

Next, as shown in FIG. 2F, the boron-added SiGe layer (Ge concentration: about 0 to 30 atm %) is selectively grown epitaxially using CVD techniques again, thereby forming a second SiGe region (or a second semiconductor region) 23 of the p+ conductivity type. At this time, since the sidewall of the element isolation insulating film 11 on the element forming region side is covered with the sidewall of the silicon nitride film 22, the second SiGe region 23 can grow even in the vicinity of the element isolation insulating film 11. For this reason, the second SiGe film 23 can be made thick.

It is desirable that the Ge concentration in the second SiGe region 23 be equal to, or less than the Ge concentration in the first SeGe region 21. Where the Ge concentration in the second SiGe region 23 is low, the diffusion toward the Si region located NiSi can be suppressed effectively. Furthermore, the Ge concentration in the second semiconductor region may be "0"; in other words, the second semiconductor region 23 may be formed of Si only.

Figure 2G:
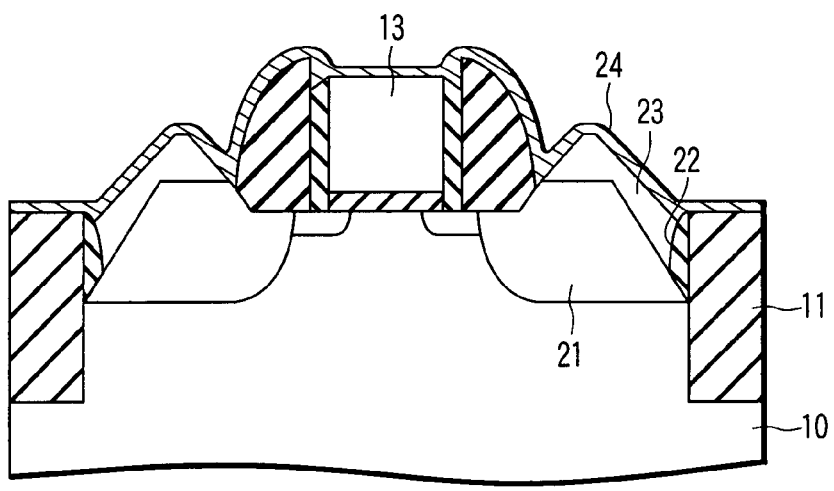

Next, as shown in FIG. 2G, as the cap film of the gate polycrystalline Si composed of the silicon nitride film 14 is removed by an etching process using thermal phosphoric acid, a metal for forming a silicide, such as a nickel (Ni) film 24, is deposited on the entire surface to a thickness of about 10 nm. Thereafter, heat treatment is performed at about 300 to 450° C., with the result that Si or SiGe at the surface of the gate electrode 13 and at the surface of the SiGe regions 21, 23 of the p+ conductivity type reacts with the Ni film, thereby forming a nickel silicide film 25. Then, after the unreacted Ni film 24 is removed with such a chemical as SPM or APM, the resulting film is heat-treated at 400° C. to 500° C., thereby turning the nickel silicide film 25 completely into a low-resistance nickel monosilicide (NiSi) film. As a result of this, the structure shown in FIG. 1 is obtained.

From this point on, a wiring layer to connect with the surface of the polycrystalline Si gate electrode 13 and the surface of the p+-type SiGe regions 21, 23 is formed, which completes a transistor element.

As described above, with the embodiment, the process of embedding SiGe in the source-drain contact region by selective epitaxial growth techniques is divided into two. In a first selective epitaxial growth, the groove on the gate electrode side is filled completely again so that a silicon nitride film sidewall may be formed on the inside wall of the element isolation insulating region remaining in the facet region of SiGe produced in the part adjacent to the element isolation insulating region at the time of the first selective epitaxial growth. This makes it possible to form an SiGe layer in the part adjacent to the element isolation insulating film region without forming a facet at time of a second selective epitaxial growth.

Accordingly, it is possible to prevent the SiGe region from getting extremely thin in the vicinity of the element isolation insulating film region as shown in FIG. 3, which enables the silicide film formed on the source-drain-contact region to be held easily only in the p+-type SiGe region.

By changing the structure and process as described above, the silicide film formed to reduce parasitic resistance can be prevented from cutting into the substrate at the interface between the element isolation insulating film and the source-drain-contact region, which enables the occurrence of a junction leak to be suppressed. Accordingly, it is possible to suppress the occurrence of a junction leak, while improving the driving power of the MOS FET element.

(Modification)

The invention is not limited to the above embodiment. While in the embodiment, SiGe has been used as the first and second semiconductor regions, other semiconductor materials may be used. The first semiconductor regionare for applying a stress to the channel and have only to be semiconductor material whose lattice constant differs from that of silicon. Specifically, when an n-channel MOS is formed, SiC may be used to apply a pulling stress to the channel. Moreover, the substrate is not restricted to Si and may be composed of another semiconductor material. In this case, too, the first and second semiconductor regions have only to differ from the substrate in the lattice constant.

Furthermore, in the first and second semiconductor regions, impurities are not necessarily doped at the time of their growth and may be doped by ion implantation or the like after their epitaxial growth. Moreover, the conducting film is not limited to the nickel silicide and may be any compound of metal and semiconductor as long as the compound contains nickel as a main component. In addition to nickel, another metal, such as cobalt or platinum, may be used.

Moreover, while in the embodiment, the example of a MOSFET using a silicon oxide film as a gate insulating film has been explained, the invention may, of course, be applied to an MISFET using an insulating film other than a silicon oxide film as the gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an element isolation insulating film which is provided so as to enclose an element forming region of a semiconductor substrate whose main component is silicon and is composed of an insulating material whose main component is silicon oxide;
    a gate electrode which is formed at a part of a region above the element forming region via a gate insulating film;
    diffused layers which are formed in the semiconductor substrate so as to sandwich a channel region below the gate electrode;
    first semiconductor regions which are formed between the diffused layers and the element isolation insulating film, and in contact with the diffused layers, an upper surface position of a region where the first semiconductor regions are close to the element isolation insulating film being lower than a lowermost surface position of the diffused layers, the first semiconductor regions being composed of semiconductor material whose lattice constant differs from that of silicon and having the same conductivity type as that of the diffused layers;
    a silicon nitride film which is formed in a region where the first semiconductor regions and the element isolation insulating film are close to each other and in contact with the upper surface of the first semiconductor regions and a side surface of the element isolation insulating film;
    second semiconductor regions formed on top of the first semiconductor regions and in contact with a side surface of the silicon nitride film, the second semiconductor regions being composed of semiconductor material whose lattice constant differs from that of silicon and having the same conductivity type as that of the diffused layers; and
    a conducting film which is formed at the surface of the second semiconductor regions.

2. The semiconductor device according to claim 1, wherein the first and second semiconductor regions are a mixture of germanium and silicon.

3. The semiconductor device according to claim 1, wherein the first and second semiconductor regions are a mixture of silicon and carbon.

4. The semiconductor device according to claim 1, wherein the conducting film is a compound whose main component is any one of nickel silicide, cobalt silicide, and platinum silicide.

5. The semiconductor device according to claim 1, wherein the semiconductor substrate is a single-crystal silicon having (100) surface direction at its principal surface.

6. A semiconductor device comprising:
    an element isolation insulating film which is provided so as to enclose an element forming region of an n-type silicon substrate and is made of a silicon oxide;
    a gate electrode which is formed at a part of a region above the element forming region via a gate insulating film;
    p-type diffused layers which are formed in the silicon substrate so as to sandwich a channel region below the gate electrode;
    p-type semiconductor regions which are formed between the p-type diffused layers and the element isolation insulating film, and in contact with the p-type diffused layers, and are composed of a mixture of germanium and silicon;
    a silicon nitride film which is formed in a region where the semiconductor regions and the element isolation insulating film are close to each other and in contact with a side surface of the semiconductor regions and a side surface of the element isolation insulating film, the silicon nitride film being in contact only with that portion of the side surface of the element isolation insulating film which is located above the lowermost part of the p-type semiconductor regions; second semiconductor regions formed on top of the p-type semiconductor regions, and in contact with a side surface of the silicon nitride film; and a conducting film which is formed at a surface of the second semiconductor regions and is composed of a compound of the second semiconductor region and metal.

7. The semiconductor device according to claim 6, wherein the conducting film is a compound whose main component is any one of nickel silicide, cobalt silicide, and platinum silicide.

8. The semiconductor device according to claim 6, wherein the silicon substrate has (100) surface direction at its principal surface.

9. The semiconductor device according to claim 1, wherein
the first semiconductor regions have a slanted upper surface such that the first semiconductor regions have a thickness that decreases from a position corresponding to the diffusion layer to a position corresponding to the element isolation insulating layer, and
the silicon nitride film is formed in a region sandwiched between an upper surface of the first semiconductor region and a side surface of the element isolation insulating layer.

* * * * *